(12) United States Patent
Manan

(10) Patent No.: US 8,054,128 B2
(45) Date of Patent: Nov. 8, 2011

(54) CURRENT CONTROL MECHANISM FOR LOW VOLTAGE APPLICATIONS

(75) Inventor: Vikas Manan, Sunnyvale, CA (US)

(73) Assignee: GigOptix, Inc., Palo Alto, CA (US)

( * ) Notice: Subject to any disclaimer, the term of this patent is extended or adjusted under 35 U.S.C. 154(b) by 0 days.

(21) Appl. No.: 12/795,451

(22) Filed: Jun. 7, 2010

(65) Prior Publication Data

US 2010/0244956 A1    Sep. 30, 2010

Related U.S. Application Data

(63) Continuation of application No. 12/150,615, filed on Apr. 29, 2008, now Pat. No. 7,760,781.

(51) Int. Cl.
*H03F 1/00* (2006.01)
*H03F 3/00* (2006.01)
*H03F 3/04* (2006.01)
*H03F 3/45* (2006.01)

(52) U.S. Cl. .................. 330/192; 330/250; 330/254

(58) Field of Classification Search .................. 330/192, 330/250, 254
See application file for complete search history.

(56) References Cited

U.S. PATENT DOCUMENTS

| | | |
|---|---|---|
| 5,883,910 A | 3/1999 | Link |
| 6,021,144 A | 2/2000 | Meyer et al. |
| 6,618,406 B1 | 9/2003 | Kaminishi |
| 6,642,878 B2 | 11/2003 | Libove et al. |
| 6,794,934 B2 | 9/2004 | Betti-Berutto et al. |
| 6,816,017 B2 | 11/2004 | Yamashita et al. |
| 7,006,543 B2 | 2/2006 | Self et al. |
| 7,098,740 B2 | 8/2006 | Kondo et al. |
| 7,154,336 B2 | 12/2006 | Maeda |
| 7,304,541 B2 | 12/2007 | Baree et al. |

*Primary Examiner* — Armando Rodriguez
(74) *Attorney, Agent, or Firm* — Crowell & Moring LLP

(57) ABSTRACT

A current control mechanism for use in low power consumption circuits with limited headroom includes a differential transistor pair from whose collectors a current output is taken. The current output is a function of a reference voltage provided at bases of a reference transistor pair having emitters that are coupled to the bases of the differential pair. The reference voltage is controlled by a pair of control transistors that control current through a load. A pair of tracking transistors can be provided to track supply voltage. A single-ended topology can also be implemented.

4 Claims, 3 Drawing Sheets

CURRENT CONTROL MECHANISM FOR LOW VOLTAGE APPLICATIONS

RELATED APPLICATIONS

This application is a Continuation of U.S. application Ser. No. 12/150,615 filed on Apr. 29, 2008, now allowed.

BACKGROUND

1. Technical Field

The present disclosure relates generally to current control mechanisms for use in low power consumption circuits.

2. Background

The trend of reduced power consumption in circuits has led to the increased use of lower supply voltages. Consistent with this trend is the use of 3.3-volt power supplies, which are significantly lower than conventional 5.0-volt power supplies, and which impose a new set of restrictions that must be taken into account. For instance, while InGaP HBT (indium gallium phosphide heterojunction bipolar transistor) devices are particularly well-suited for optoelectronic device driver applications such that illustrated in FIG. 1, the InGaP HBT base-to-emitter voltage ($V_{be}$) of about 1.4 volts is appreciably higher than that of conventional HBT and BJT (bipolar junction transistors) devices fabricated in Si/Ge or InP. This makes it very challenging to design current sources (current mirrors) for InGaP HBT circuits because two $V_{be}$ drops of InGaP HBT devices take up about 2.8 volts, leaving only about 500 mV headroom for the current source. The 500 mV remaining headroom for the $V_{ce}$ (collector-to-emitter voltage) of the current mirror is not sufficient as the current mirror transistor is close to saturation. In addition, when the $V_{cc}$ (power supply voltage) drops due to some variations, for instance by 5%, the voltage headroom drops further, to for example only 350 mV.

The driver circuit 100 of FIG. 1 employs an IC (integrated circuit) 102 to drive a modulator 104 in order to modulate a light output signal. IC 102 relies on transistors, such as HBTs or BJTs, to effect the necessary voltage switching at the high frequencies required for fast light modulation operations. Inverted and non-inverted input signals are provided at input side 106. The output voltage of the IC needs to be flexible because different modulators require different output voltage from the IC in order to switch the light on and off. The ability to change the current is also important to take process variation in die fabrication into account. This output voltage change is realized by changing the current in the output stage of the driver IC. Power, typically about 5.0 volts, is provided at terminal $V_{cc}$. The use of lower power levels, such as 3.3 volts, particularly with InGaP HBT devices, can be problematic due to the limited headroom imposed by the increased (1.4 volts) base-to-emitter voltage $V_{be}$ of current mirrors striving to employ such devices. There is therefore a long-felt need for a current source other than a conventional current mirror to drive a low power consumption optoelectronic driver circuit using InGaP HBT devices.

OVERVIEW

As described herein, a current control circuit includes a differential pair of transistors each having a base, emitter and collector, the emitters of the pair of transistors being coupled together at a common node through which a differential pair current flows, and each collector of the pair of transistors providing an output; a pair of reference transistors (emitter followers) each coupled between a voltage supply and a base of an associated one of the differential pair of transistors, each reference transistor having a reference node at a base thereof; a current source configured to supply current through each reference node; and a pair of control transistors each configured to control a voltage of an associated one of the reference nodes by controlling current through a load that is coupled to the associated reference node.

Also described herein is an optoelectronic device driver circuit that includes a plurality of differential amplifier stages, at least one of which comprises a differential pair of transistors each having a base, emitter and collector, the emitters of the pair of transistors being coupled together at a common node through which a differential pair current flows, and each collector of the pair of transistors providing an output; a pair of reference transistors (emitter followers) each coupled between a voltage supply and a base of an associated one of the differential pair of transistors, each reference transistor having a reference node at a base thereof; a current source configured to supply current through each reference node; and pair of control transistors each configured to control a voltage of an associated one of the reference nodes by controlling current through a load that is coupled to the associated reference node.

Also described herein is an optoelectronic system comprising a laser diode and one or more differential amplifier stages. The one or more differential amplifier stages are connected in cascade such that the ultimate stage is configured for coupling to the laser diode for driving same in accordance with a modulation signal. At least one of the differential amplifier stages includes a differential pair of transistors each having a base, emitter and collector, the emitters of the pair of transistors being coupled together at a common node through which a differential pair current flows, and each collector of the pair of transistors providing an output; a pair of reference transistors (emitter followers) each coupled between a voltage supply and a base of an associated one of the differential pair of transistors, each reference transistor having a reference node at a base thereof; a current source configured to supply current through each reference node; and a pair of control transistors each configured to control a voltage of an associated one of the reference nodes by controlling current through a load that is coupled to the associated reference node.

Also described herein is a current control circuit for a broadband amplifier. The circuit includes an output transistor for supplying an output current at an output node coupled to the emitter of the transistor; a reference transistor having a reference node at a base thereof, the reference transistor (emitter follower) being coupled between a voltage supply and a base of the output transistor; a current source configured to supply current through the reference node; and a control transistor configured to control a voltage of the reference nodes by controlling current through a load that is coupled to the reference node.

BRIEF DESCRIPTION OF THE SEVERAL VIEWS OF THE DRAWINGS

The accompanying drawings, which are incorporated into and constitute a part of this specification, illustrate one or more examples of embodiments and, together with the description of example embodiments, serve to explain the principles and implementations of the embodiments.

DESCRIPTION OF EXAMPLE EMBODIMENTS

Figure 1:
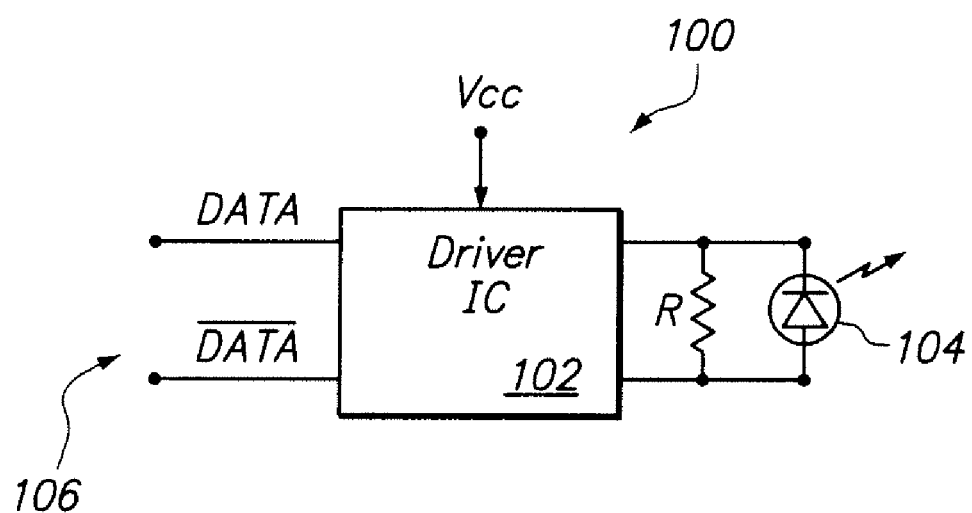
FIG. 1 is a schematic diagram of an optoelectronic device driver circuit in accordance with one embodiment.

The description herein is provided in the context of a current control mechanism for low voltage applications. Those of ordinary skill in the art will realize that the following detailed description is illustrative only and is not intended to be in any way limiting. Other embodiments will readily suggest themselves to such skilled persons having the benefit of this disclosure. Reference will now be made in detail to implementations as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure As used herein, the symbol n+ indicates an n-doped semiconductor material typically having a doping level of n-type dopants on the order of $10^{20}$ atoms per cubic centimeter or more. The symbol n− indicates an n-doped semiconductor material (such a silicon (Si), germanium (Ge), Gallium Arsenide (GaAs), and the like) typically having a doping level on the order of $10^{17}$ atoms per cubic centimeter for n− doped wells and on the order of $10^{15}$ atoms per cubic centimeter for n− substrate material. The symbol p+ indicates a p-doped semiconductor material typically having a doping level of p-type dopants on the order of $10^{20}$ atoms per cubic centimeter or more. The symbol p− indicates a p-doped semiconductor material typically having a doping level on the order of $10^{17}$ atoms per cubic centimeter for p− doped wells and on the order of $10^{15}$ atoms per cubic centimeter for p− substrate material. Those of ordinary skill in the art will now realize that a range of doping concentrations around those described above will also work. Furthermore, the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skill in the art. Essentially, any process capable of forming pFETs and nFETs will work. Doped regions may be diffusions or they may be implanted. When it is said that something is doped at approximately the same level as something else, the doping levels are within a factor of ten of each other, e.g., $10^{16}$ is within a factor of ten of $10^{15}$ and $10^{17}$.

Figure 2:
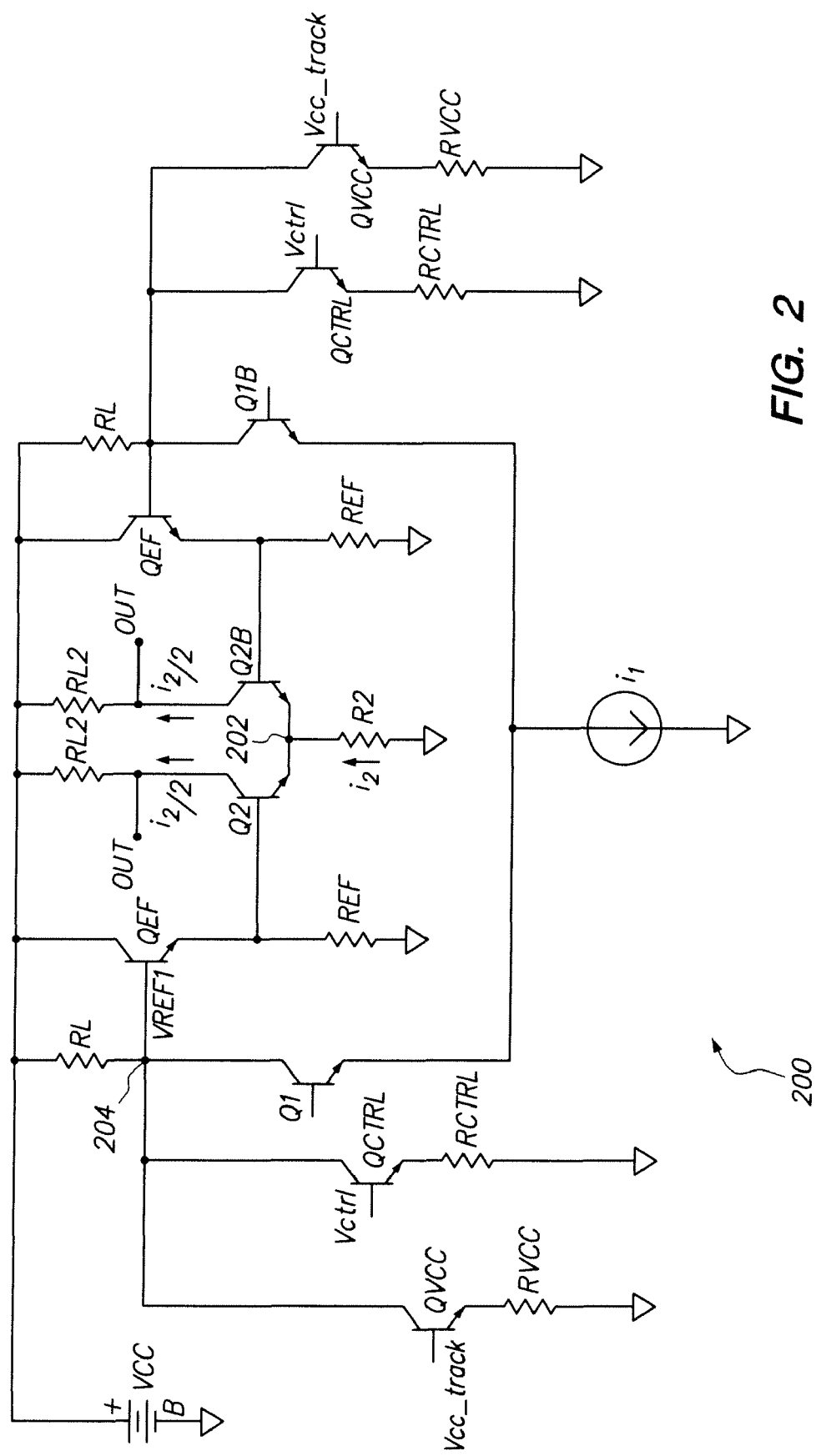
FIG. 2 is a circuit topology that includes a current control mechanism for use in low power consumption circuits, such as those used to drive an optoelectronic device, in accordance with one embodiment.
Figure 3:
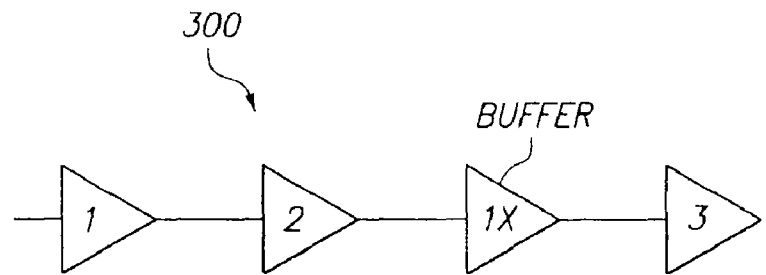
FIG. 3 is high-level diagram of a multi-stage differential amplifier chain used to drive a laser diode in accordance with one embodiment.

FIG. 2 is a circuit topology that includes a current control mechanism for use in low power consumption circuits, such as those used to drive an optoelectronic device. Circuit 200 is part of a multi-stage differential amplifier chain used to drive a laser diode (not shown), and is represented schematically in FIG. 3. The circuit 200 of FIG. 2 is particularly well-suited for use with InGaP HBT devices, although this is not intended to be a limitation and other types of transistors or solid state devices, such as diodes, can be used therein. The current control mechanism of circuit 200 is implemented in the penultimate stage of this chain, which, in the three-stage example of FIG. 3, is the second stage including transistors Q2 and Q2B. This is not intended to be limiting, however, and the control mechanism can readily be employed in other stages.

Returning to FIG. 2, circuit 200 implements control of the current $i_2$ of the second stage of the differential amplifier chain 300 of FIG. 3. The output of the second stage is taken at the nodes OUT in the diagram. The current $i_1$ of the first stage is implemented using a resistor.

A current $i_2/2$ flows through the differential transistor pair Q2, Q2B. The current $i_2$ through the resistor R2 is set by the voltage at the emitter of Q2, Q2B (node 202). This voltage at 202 can be varied by changing the DC current through resistor RL (resistor RL represents the load resistance of the previous stage) since the $V_{be}$ of the two transistors QEF (reference transistor) and Q2 is almost fixed. $V_{REF1}$ at reference node 204 is a function of this current through resistor RL. Changes in the DC current through resistor RL, and commensurately the voltage $V_{REF1}$ at node 204, can be effected by altering the control voltage $V_{ctrl}$. Specifically, considering the control transistor $Q_{CTRL}$, when $V_{ctrl}$ is greater than its base-to-emitter voltage $V_{be}$, ($V_{ctrl} > V_{be}$), the current $L_{ctrl}$ through the control transistor $Q_{CTRL}$ is given approximately by $$I_{ctrl} = (V_{ctrl} - V_{be})/R_{CTRL}$$

thus the voltage change at $V_{REF1}$, which is a function of $V_{ctrl}$, sets the change in $i_2$ through the resistor R2.

The control current $I_{ctrl}$ is, in addition to $i_1/2$, flowing through the differential pair Q1, Q1B. This control current flows through the control transistor $Q_{CTRL}$. By altering the current through $Q_{CTRL}$, the DC voltage drop across RL ($V_{REF1}$) can be changed. The voltage change in $V_{REF1}$ is given by $I_{ctrl} \times RL$. This change in the DC value changes the voltage at the emitter of Q2, Q2B, as the voltage at the emitter is given by $V_{REF1} - 2V_{be}$.

The tracking transistors QVCC are used to keep the current $i_2$ constant in spite of changes in voltage supply VCC by altering the current flowing through QVCC. When voltage supply VCC increases, the current through QVCC increase by using Vcc_track as a tracking signal for VCC.

Figure 4:
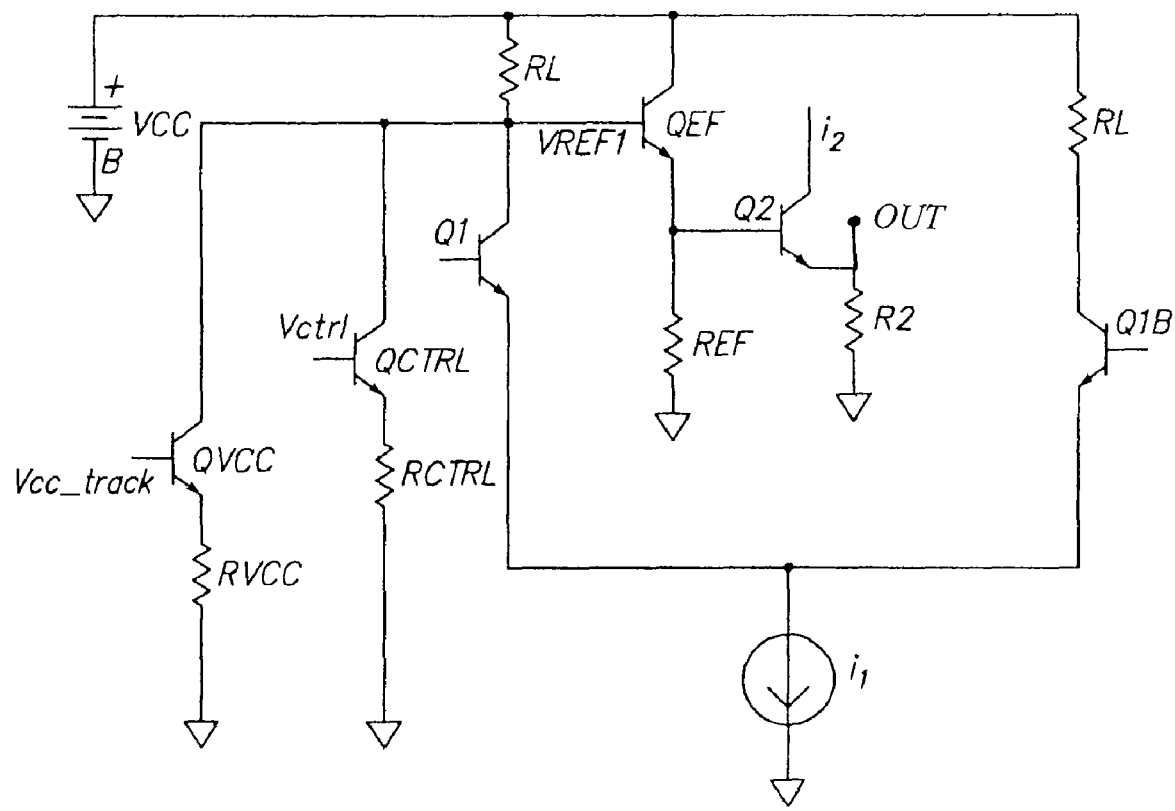
FIG. 4 is an electrical schematic diagram of a circuit for current control in single-ended common emitter broadband amplifier design.

Current control can similarly be effected using a single-ended topology as seen in FIG. 4. The circuit of FIG. 4 can be used for current control in single-ended common emitter broadband amplifier design. The gain of the amplifier is dependent on the impedance to ground present at the emitter. The higher the impedance, the lower the gain. Normally, a current mirror cannot be used for controlling the current in a single-ended design as it has very high impedance and the amplifier would have very low gain if the current mirror was used, unless it was shunted by a large capacitor, which is difficult to realize on-chip for broadband applications.

The single-ended designs invariably use a degeneration resistor at the emitter for bandwidth enhancement and for preventing thermal runaway. With reference to FIG. 4, it can be seen that the voltage at the emitter of output transistor Q2 sets the current $i_2$ in this design. This voltage in turn is set by $V_{REF1}$ at the base of the reference transistor QEF as the voltage drop $V_{be}$ across QEF and Q2 is almost fixed (it does not vary much with current). By using a control current flowing through control transistor QCTRL, the voltage $V_{REF1}$ can be altered. This in turn alters the current $i_2$ through R2 in the manner described above with reference to circuit 200.

The tracking transistor QVCC is used to keep the current $i_2$ constant in spite of changes in voltage supply VCC by altering the current flowing through QVCC. When VCC increases, the current through QVCC increase by using Vcc_track as a tracking signal for VCC.

The above are exemplary modes of carrying out the invention and are not intended to be limiting. It will be apparent to those of ordinary skill in the art that modifications thereto can be made without departure from the spirit and scope of the invention as set forth in the following claims.

The invention claimed is:

1. A current control circuit for a broadband amplifier, the circuit comprising:

an output transistor for supplying an output current at an output node coupled to the emitter of the transistor;

a reference transistor having a reference node at a base thereof, the reference transistor being coupled between a voltage supply and a base of the output transistor;

a current source configured to supply current through the reference node; and a control transistor configured to control a voltage of the reference node by controlling current through a load that is coupled to the reference node.

2. The circuit of claim 1, further comprising a tracking transistor coupled to the reference node, the tracking transistor varying current through the reference node based on variations in voltage from the voltage supply.

3. The circuit of claim 1, wherein at least one of the transistors is an InGaP device.

4. The circuit of claim 1, wherein the current source is a current mirror coupled to the reference node.

* * * * *